United States Patent [19]

Oka et al.

[11] Patent Number: 5,631,866
[45] Date of Patent: May 20, 1997

[54] SEMICONDUCTOR MEMORY DEVICE

[75] Inventors: Tomoharu Oka; Yukinori Kodama; Katsumi Shigenobu, all of Kawasaki, Japan

[73] Assignee: Fujitsu Limited, Kawasaki, Japan

[21] Appl. No.: 444,579

[22] Filed: May 19, 1995

[30] Foreign Application Priority Data

May 31, 1994 [JP] Japan .................................. 6-118185

[51] Int. Cl.⁶ .............................. G11C 7/00; G11C 8/00
[52] U.S. Cl. ............. 365/189.05; 365/194; 365/230.03; 365/233
[58] Field of Search .......................... 365/189.05, 194, 365/230.03, 230.08, 233; 371/38

[56] References Cited

U.S. PATENT DOCUMENTS

| | | | |
|---|---|---|---|
| 4,845,664 | 7/1989 | Aichelmann, Jr. et al. | 371/38 |
| 5,319,607 | 6/1994 | Fujii et al. | 365/233.5 |
| 5,341,341 | 8/1994 | Fukuzo | 365/233 |
| 5,384,745 | 1/1995 | Konishi et al. | 365/230.03 |
| 5,440,511 | 8/1995 | Yamamoto et al. | 365/189.05 |
| 5,483,497 | 1/1996 | Mochizuki et al. | 365/230.03 |

*Primary Examiner*—David C. Nelms
*Assistant Examiner*—Trong Phan
*Attorney, Agent, or Firm*—Armstrong, Westerman, Hattori, McLeland & Naughton

[57] ABSTRACT

A synchronous DRAM is disclosed. The DRAM comprises an input buffer, a memory cell array, an output buffer, a signal transfer circuit, first and second latch circuits, and a controller. The input buffer receives an operation control signal supplied externally. The memory cell array has a plurality of memory cells for storing data. The output buffer outputs a data signal read from the memory cells. The signal transfer circuit reads a data signal from one of the memory cells in accordance with the operation control signal from the input buffer, and sends this read data signal to the output buffer. The first and second latch circuits, provided between the input buffer and the output buffer, latch the associated input signals in response to a clock signal. The controller controls the latching operation of the second latch circuit by delaying the clock signal input to the second latch circuit for a period of time from when the first latch circuit receives input from the input buffer to when the read data signal arrives at the second latch circuit.

11 Claims, 10 Drawing Sheets

SEMICONDUCTOR MEMORY DEVICE

BACKGROUND OF THE INVENTION

1. Field of the Invention

The present invention relates generally to a semiconductor memory device. More particularly, this invention relates to a semiconductor memory device which performs data input and output operation in synchronism with a clock signal.

2. Description of the Related Art

Dynamic Random Access Memory (DRAM) is an increasingly popular choice of memory device for use as a component in many of today's computer processors. One reason for this is its small size. A second reason for the popularity of DRAM today is its capacity for high speed operation. In particular, synchronous DRAM devices perform input/output operations in synchronism with a clock signal. This makes synchronous DRAM an ideal complement to the progressively faster processing units in computers today.

Figure 1:
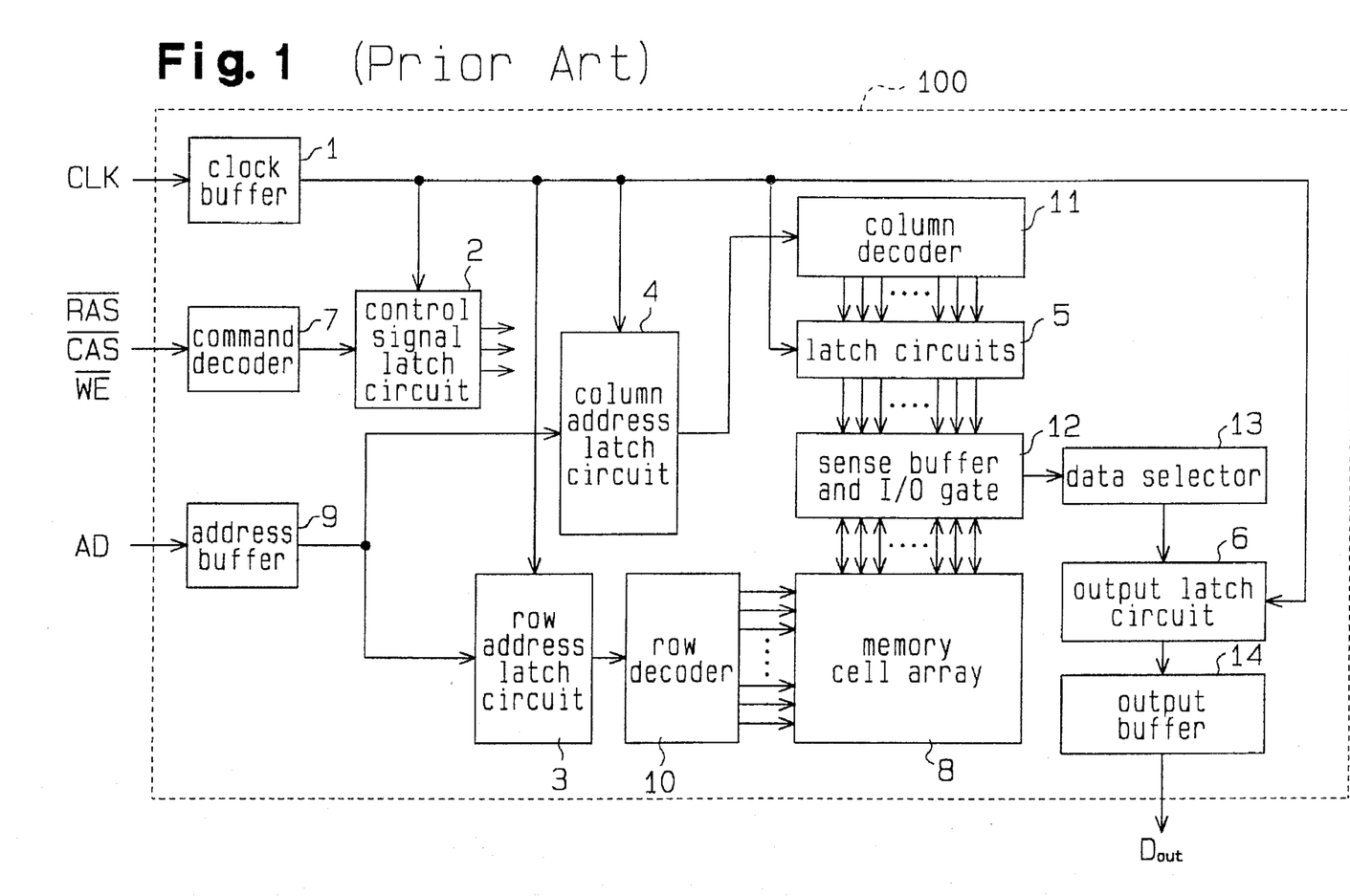
FIG. 1 is a block diagram illustrating a conventional synchronous DRAM.
Figure 2:
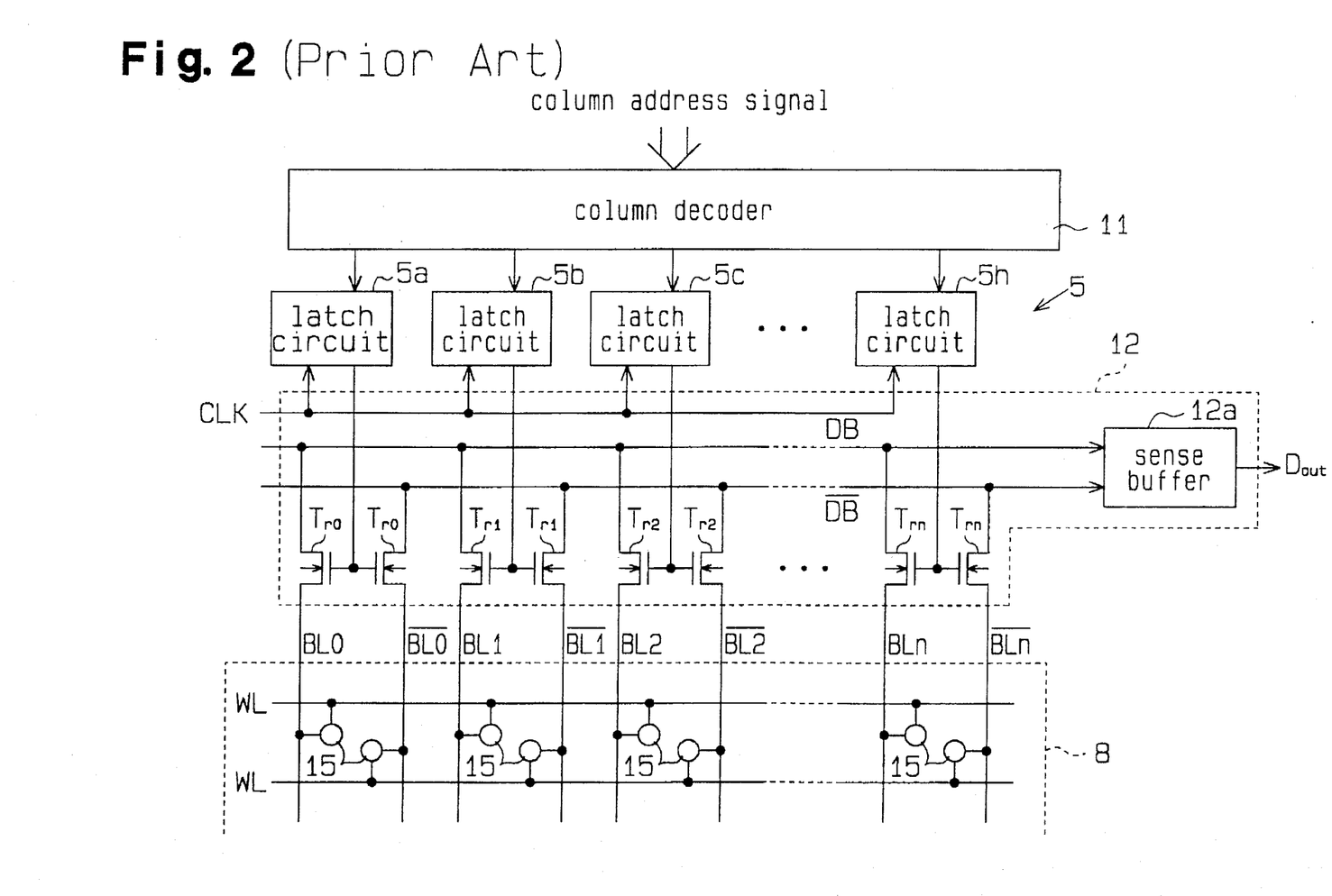
FIG. 2 is a circuit diagram showing a conventional sense buffer and I/O gate.

FIGS. 1 and 2 illustrate a conventional synchronous DRAM. The synchronous DRAM 100 has a clock buffer 1, a control signal latch circuit 2, a row address latch circuit 3, a column address latch circuit 4, a group of latch circuits 5, an output latch circuit 6, a command decoder 7, a memory cell array 8, an address buffer 9, a row decoder 10, a column decoder 11, a sense buffer and I/O gate 12, a data selector 13 and an output buffer 14.

The clock buffer 1 receives and temporarily holds a clock signal CLK output from an external clock generator (not shown), and supplies the clock signal CLK to the control signal latch circuit 2, the row address latch circuit 3, the column address latch circuit 4, the latch circuits 5 (see FIG. 2) and the output latch circuit 6.

The command decoder 7 receives control signals /RAS and /CAS and a write enable signal /WE, output from an external control circuit (not shown) such as a CPU, and outputs those signals to the control signal latch circuit 2. The control signal latch circuit 2 latches the individual control signals /RAS, /CAS and /WE and outputs them to a peripheral circuit (e.g., the output buffer 14) of the memory cell array 8 in response to the clock signal CLK.

The address buffer 9 receives an address signal AD from an external control circuit (not shown) and divides it into a row address signal and a column address signal. The address buffer 9 sends the row address signal to the row address latch circuit 3 and sends the column address signal to the column address latch circuit 4. The row address latch circuit 3 latches the row address signal in synchronism with the clock signal CLK and outputs the signal to the row decoder 10. The column address latch circuit 4 latches the column address signal in synchronism with the clock signal CLK and outputs it to the column decoder 11.

The row decoder 10 decodes the row address signal to produce a word line select signal and outputs this signal to the memory cell array 8. In accordance with this word line select signal, a specific word line is selected from a plurality of word lines in the memory cell array 8. The column decoder 11 decodes the column address signal to produce a bit line select signal and outputs this signal to the latch circuits 5. The latch circuits 5 latch the bit line select signal from the column decoder 11 in synchronism with the clock signal CLK, and output this select signal to the sense buffer and I/O gate 12.

The sense buffer and I/O gate 12 selects a specific column from a plurality of columns (each column consisting of a pair of bit lines) in the memory cell array 8 in response to the bit line select signal from the column decoder 11. The memory cell array 8 has the word lines, pairs of bit lines, and multiple memory cells connected to the word lines and the pairs of bit lines. In a reading operation from the memory cells, the sense buffer and I/O gate 12 first reads data signal from those memory cells in the memory cell array 8 selected by the individual select signals via the row decoder 10 and the column decoder 11. The sense buffer and I/O gate 12 then outputs the data signal to the data selector 13. The data selector 13 in turn outputs the cell data signal from the sense buffer and I/O gate 12 to the output latch circuit 6. The output latch circuit 6 latches the data output signal from the data selector 13 in synchronism with the clock signal CLK, and outputs this signal to the output buffer 14. The output buffer 14 outputs the read cell data signal as a read data signal Dout.

The synchronous DRAM 100 further has an input buffer and a write amplifier, neither illustrated. During writing operations, the write amplifier receives write data output from the external control circuit (not shown) via the input buffer and writes it to the memory cells selected by the address signal AD.

FIG. 2 shows the specific structures of the latch circuits 5, the sense buffer and I/O gate 12 and the memory cell array 8. The memory cell array 8 has a plurality of memory cells, a plurality of bit line pairs BL0 and /BL0 to BLn and /BLn, and a plurality of word lines WL. A plurality of memory cells 15 are respectively provided between each bit line pair and between word lines WL. One of the word lines WL is selected in accordance with the word line select signal from the row decoder 10.

The sense buffer and I/O gate 12 has a plurality of pairs of transfer transistors Tr0 to Trn and a sense buffer (or sense amplifier) 12a. The individual bit line pairs BL0 and/BL0 to BLn and/BLn are connected to data buses DB and /DB via the respective transfer transistor pairs Tr0 to Trn. The transfer transistor pairs Tr0 to Trn have gates connected to the output terminals (not shown) of individual latch circuits 5a to 5h (eight latch circuits in this example) that form the group of latch circuits 5. The latch circuits 5a–5h receive the select signal from the column decoder 11 and the clock signal CLK. In synchronism with this clock signal CLK, the individual latch circuits 5a–5h respectively send an output signal corresponding to the select signal from the column decoder 11 to the gates of the respective transfer transistor pairs Tr0–Trn. In response to this output signal, one pair of transfer transistors among the transfer transistor pairs Tr0–Trn turn on, allowing the cell 15 connected to the selected one word line WL to be read on the data buses DB and /DB via the associated bit line pair. The data buses DB and /DB are connected to the sense buffer 12a, which amplifies the cell data signal read on the data buses DB and /DB and outputs the amplified data signal to the data selector 13.

When data is read from the synchronous DRAM 100, the row address latch circuit 3, upon receiving the clock signal CLK, sequentially latches the row address signals output from the address buffer 9 and outputs them to the row decoder 10.

Figure 3:
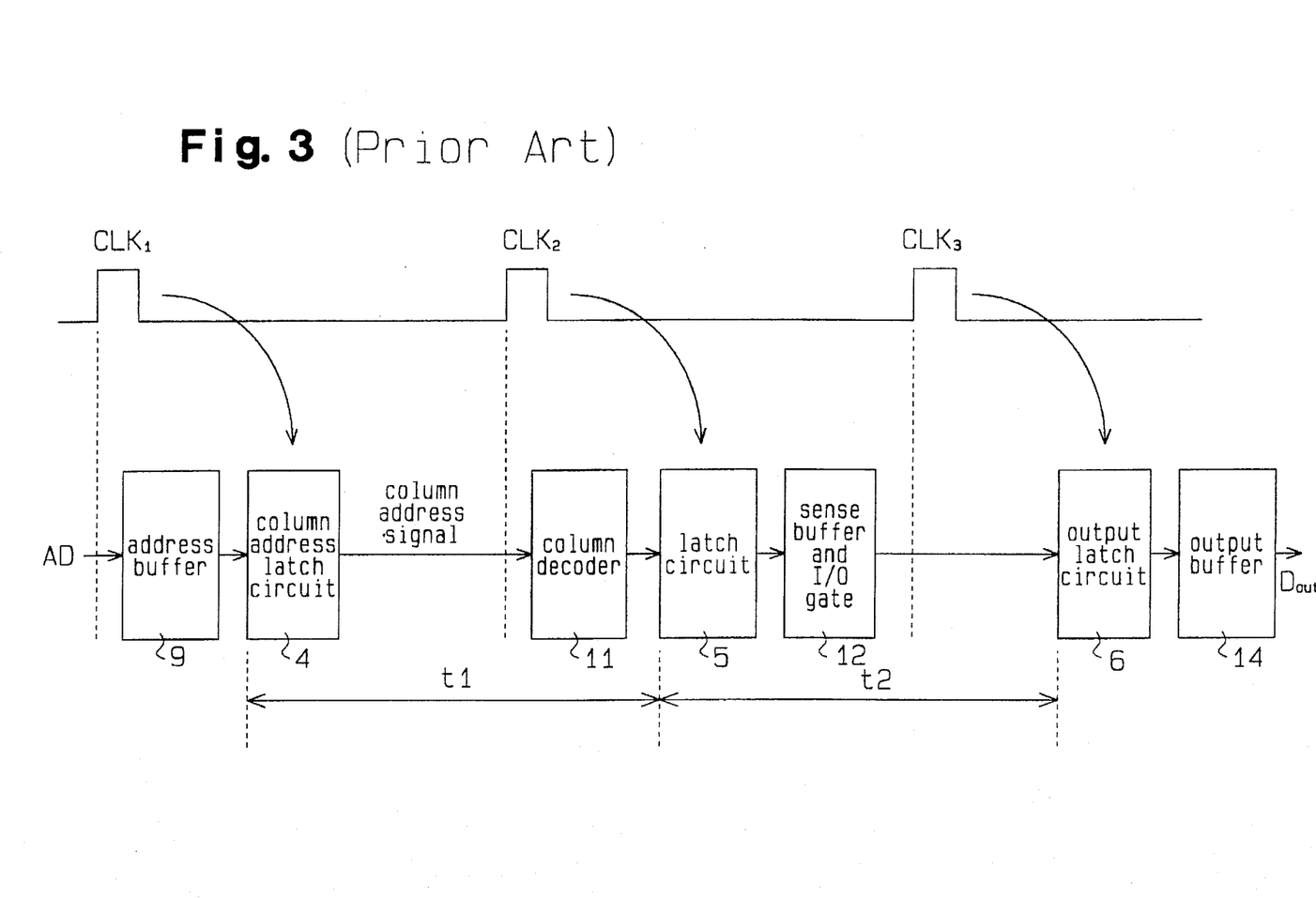
FIG. 3 is a diagram for explaining the operation of the conventional synchronous DRAM.

As shown in FIG. 3, upon reception of a first clock signal CLK$_2$ which is one pulse of the clock signal CLK, the column address latch circuit 4 latches the column address signal from the address buffer 9 and outputs the signal to the column decoder 11. The column decoder 11 decodes the column address signal and sends a bit line select signal to the latch circuits 5.

Then, the latch circuits 5 latch the select signal from the column decoder 11 and send the latched signal to the sense buffer and I/O gate 12 in synchronism with a second clock signal $CLK_2$. A memory cell 15 is selected in accordance with the select signals from the row decoder 10 and the column decoder 11, and a data signal is read from this memory cell. The sense buffer 12a amplifies the read data signal and sends it to the output latch circuit 6 via the data selector 13.

Next, the output latch circuit 6 latches the output data signal of the data selector 13 and outputs it to the output buffer 14 in synchronism with a third clock signal $CLK_3$. The output buffer 14 in turn outputs the output data signal Dout.

The aforementioned latch circuits 3 to 6 latch signals and send them to the circuits 10, 11, 12 and 14 every period of the clock signal CLK. The output buffer 14 outputs a data signal Dout every time each of the latch circuits 3–6 performs the latching operation. The synchronous DRAM 100 performs a one-cycle reading operation at every third pulse of the clock signal CLK. As the latch circuits 3–6 latch signals in synchronism with the clock signal, stable signal transfer is possible. Consequently, the time for the signal transfer can be shortened by increasing the frequency of the clock signal CLK, thus improving the speed with which cell data signals can be read.

The above-described synchronous DRAM 100 however requires that the period of the clock signal CLK should be set with a period longer than a selected time interval such as the time t2 from when the latch circuits 5 latches the select signal to when the cell data signal output by the data selector 13 arrives at the output latch circuit 6. Nonetheless, time period t2, should approach or equal time period t1. This is because the operation of the DRAM during each period requires a single period of the clock signal CLK. In other words, the individual latch circuits 4 to 6 should be designed to match the time period t1 with the time period t2. The period t1 is a transfer time from when the latch circuit 4 latches the column address signal to when the select signal arrives at the latch circuits 5. The period t2 is a transfer time from when the latch circuits 5 latches the select signal to when the cell data signal output by the data selector 13 arrives at the output latch circuit 6.

Further, the synchronous DRAM 100 has the latch circuits 5a–5h between the column decoder 11 and the sense buffer and I/O gate 12, one for each column (bit line pair). This particular arrangement of the latch circuits 5a–5h increases the circuit area of the latch circuit group 5 and thus enlarges the chip (semiconductor integrated circuit).

SUMMARY OF THE INVENTION

Accordingly, it is a primary objective of the present invention to provide a synchronous DRAM whose operation speed can be increased while reducing the circuit area.

It is another objective of this invention to provide a synchronous DRAM which eliminates the need for the time for signal transfer between latch circuits to be set equal to the period of the clock signal.

To achieve the foregoing and other objects and in accordance with the purpose of the present invention, an improved semiconductor memory device is provided, which includes by reference to the following description taken in conjunction with the following figures.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

DETAILED DESCRIPTION OF THE PREFERRED EMBODIMENTS

Figure 4:
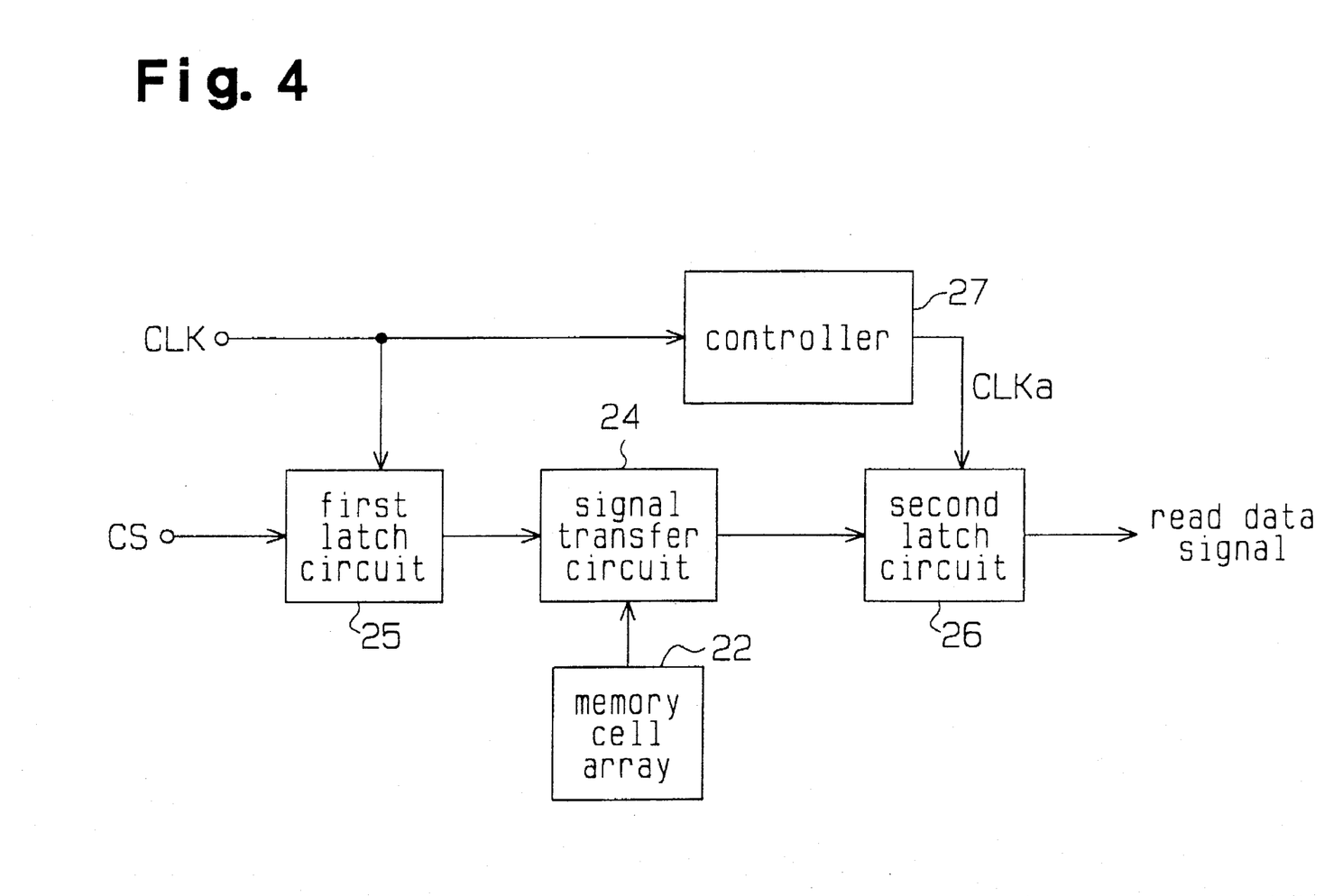
FIG. 4 is a diagram for explaining the outline of the present invention.

As shown in FIG. 4, a semiconductor memory device comprises a memory cell array 22, a signal transfer circuit 24, first and second latch circuits 25 and 26, and a controller 27. The memory cell array 22 has a plurality of memory cells for storing data. The first latch circuit 25 receives the control signal in response to a clock signal CLK, and provides a received control signal CS. The signal transfer circuit 24 is coupled to the memory cell array 24. The signal transfer circuit 24 reads a cell data signal from one of the memory cells in accordance with the provided control signal CS, and transfers the read data signal therefrom. The second latch circuit 26 is coupled to the signal transfer circuit 24. The second latch circuit 26 receives the read data signal transferred from the signal transfer circuit 24, and provides the received read data signal. The controller 27 is coupled to the second latch circuit 26. The controller 27 is responsive to the clock signal CLK, and controls a rate, at which the second latch circuit 26 receives the read data signal, according to a period of time from when the first latch circuit 25 receives the control signal CS to when the read data signal transferred from the signal transfer circuit 24 arrives at the second latch circuit 26.

This type of clock signal control eliminates the need to set the signal transference between the first and second latch circuits 25 and 26 equal to the period of the clock signal CLK. In other words, after the second latch circuit 26 receives a signal, the controller 27 outputs a clock signal CLKa to the second latch circuit 26. The second latch circuit 26 performs the signal latching operation in response to the clock signal CLKa. The first and second latch circuits 25 and 26 can therefore perform stable operations in synchronism with the clock signal CLK. It is thus possible to improve the operation speed by increasing the frequency of the clock signal CLK.

Figure 5:
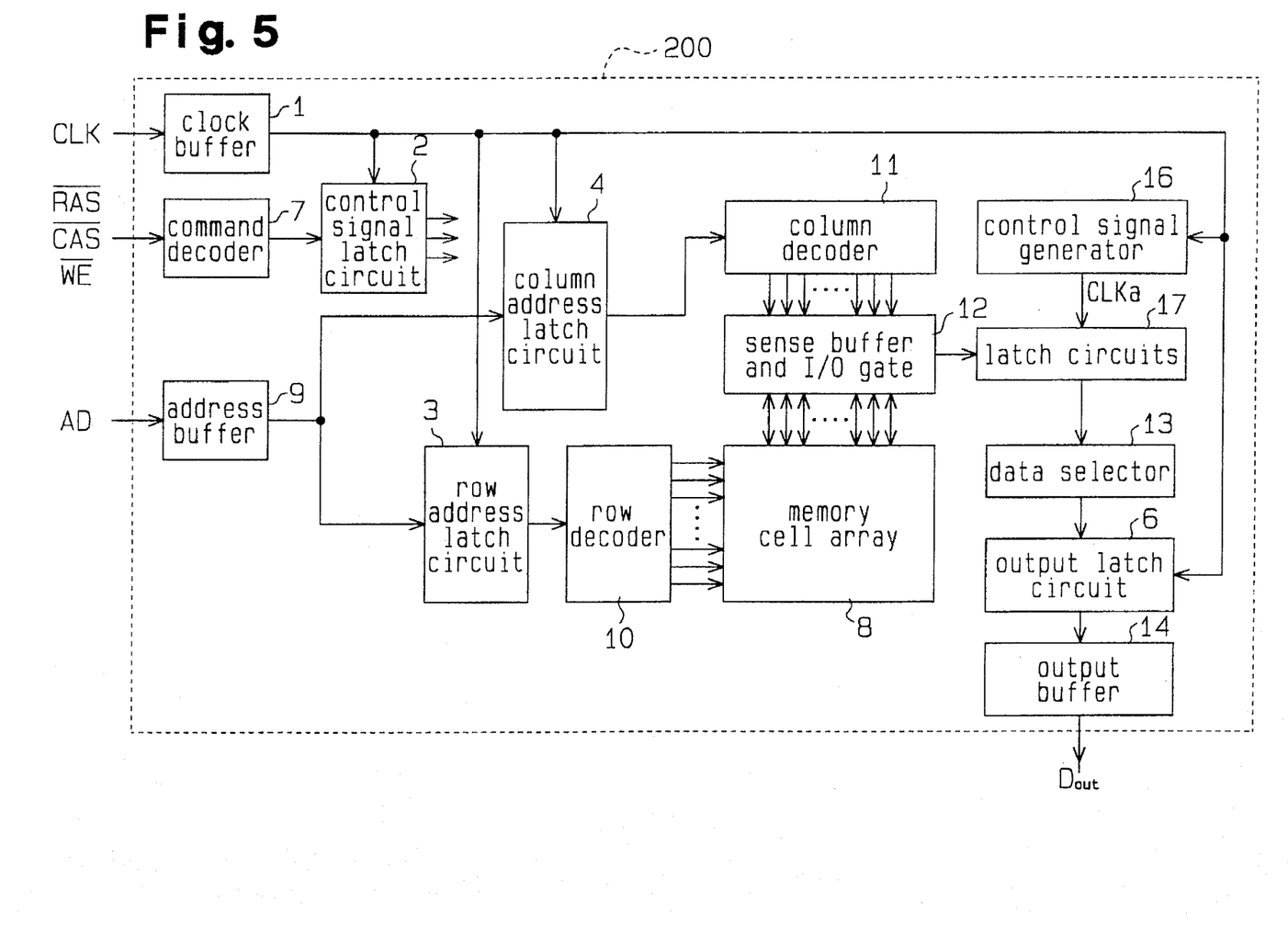
FIG. 5 is a block diagram illustrating a synchronous DRAM according to one embodiment.

A synchronous DRAM according to one embodiment of the present invention will now be described referring to FIGS. 5 through 9. In this embodiment, the present invention is adapted for a synchronous DRAM as shown in FIG. 5. Like or same reference numerals as used for the prior art will be given to corresponding or identical components, and their explanation will not be given below.

A synchronous DRAM 200 shown in FIG. 5, unlike the conventional synchronous DRAM 100, does not have latch circuits 5 shown in FIG. 1 between a column decoder 11 and a sense buffer and I/O gate 12. The synchronous DRAM 200 however has another latch circuit 17 and a control signal generator 16, which are not incorporated in the synchronous DRAM 100 in FIG. 1. The latch circuit 17 is provided between the sense buffer and I/O gate 12 and a data selector 13. The control signal generator 16 receives a clock signal CLK from a clock buffer 1 and outputs a clock signal CLKa with a slight delay to the latch circuit 17 as a control signal. The latch circuit 17 operates in response to the control signal from the control signal generator 16. The other components of the synchronous DRAM 200 are the same as that of the DRAM in FIG. 1.

Figure 6:
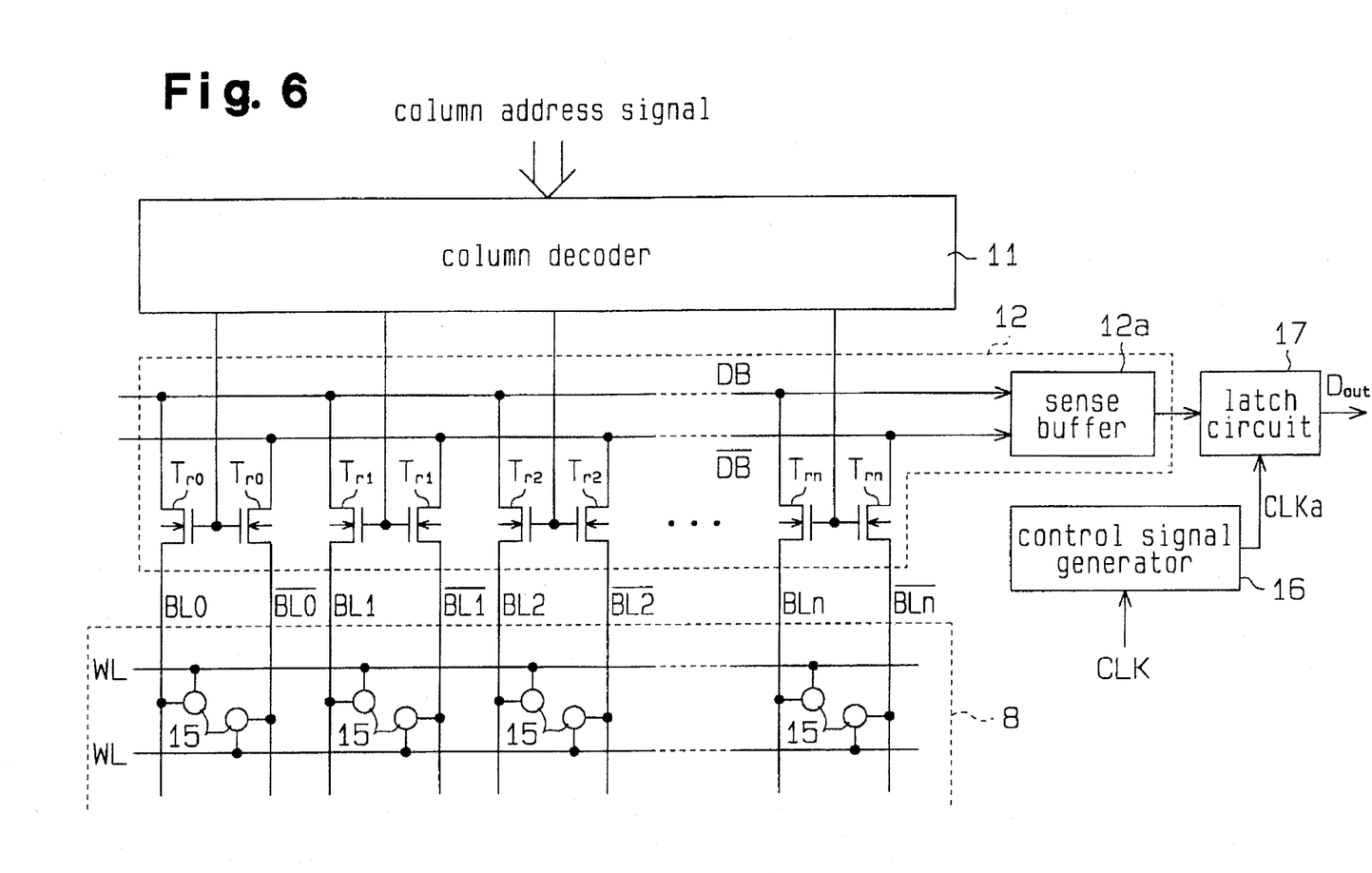
FIG. 6 is a circuit diagram showing a sense buffer and I/O gate.

FIG. 6 shows the connections among the column decoder 11, the sense buffer and I/O gate 12 and the latch circuit 17. A plurality of memory cells 15 are respectively connected to plural pairs of bit lines BL0 and /BL0 to BLn and /BLn, arranged in a memory cell array 8. Word lines WL are connected to the associated memory cells 15. One of the word lines WL is selected in accordance with a word line select signal from the row decoder 10. The individual bit line pairs BL0 and /BL0 to BLn and /BLn are connected to data buses DB and /DB via respective transfer transistor pairs Tr0 to Trn. The transfer transistor pairs Tr0 to Trn, connected to the respective bit line pairs, have gates to which the output signal (select signal) of the column decoder 11 is input. The sense buffer 12a, connected to the data buses DB and /DB, amplifies the cell data signal read on the data buses DB and/DB and outputs the amplified data signal to the latch circuit 17. For example, eight pairs of bit lines are connected to the data buses DB and /DB, and a single sense buffer 12a is connected to the data buses DB and /DB. The latch circuit 17 latches the cell data signal output from the sense buffer 12a in response to the control signal from the control signal generator 16, and sends the data to the data selector 13.

Figure 7:
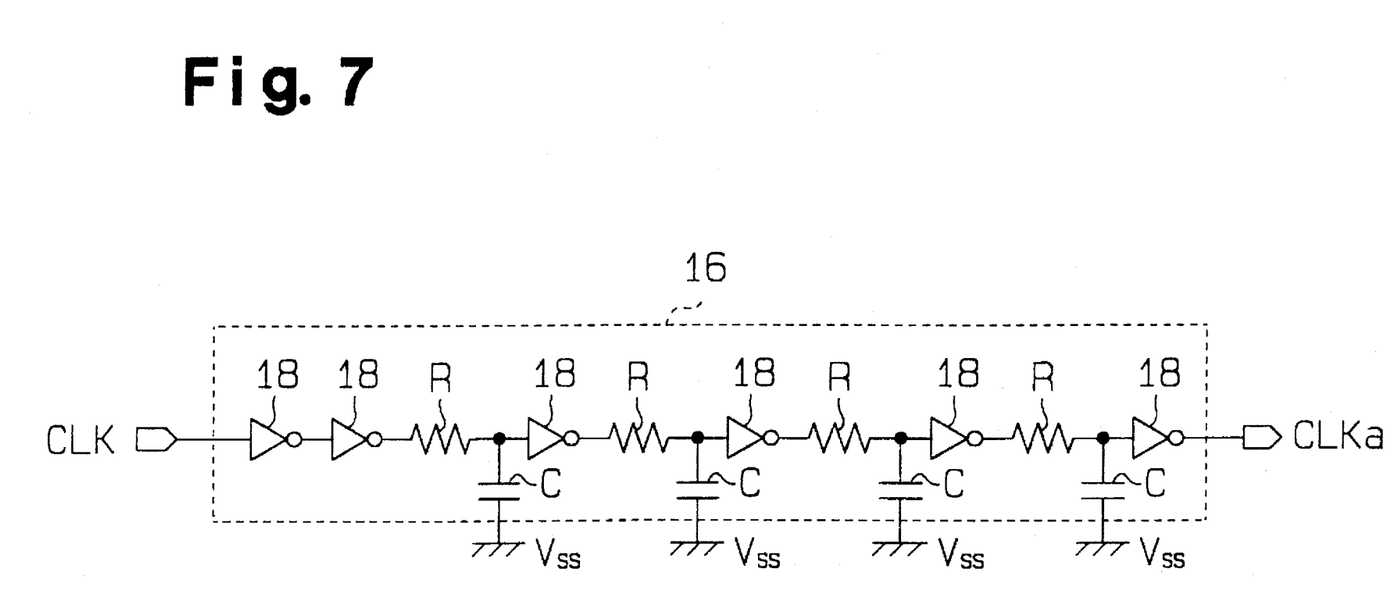
FIG. 7 is a circuit diagram showing a control signal generator.
Figure 8:
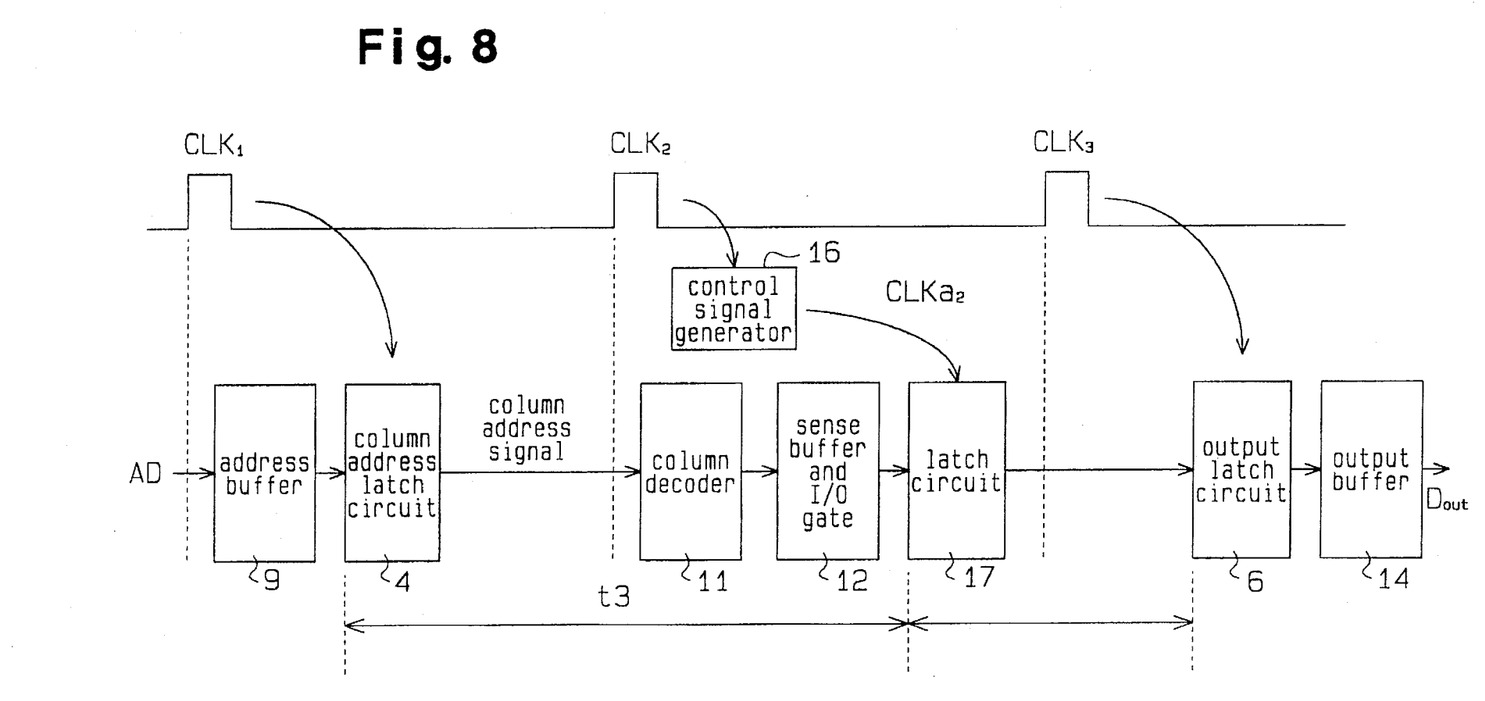
FIG. 8 is a diagram for explaining the operation of the synchronous DRAM according to this embodiment.

FIG. 7 is a circuit diagram of the control signal generator 16. The generator 16 has a series circuit of six stages of inverter circuits 18 and resistors R connected between adjacent inverter circuits 18 starting from the second stage of inverter circuit. The input terminals of the third to sixth stages of inverter circuits 18 are connected via capacitors C to the ground as a low-potential power supply Vss. The generator 16 receives the clock signal CLK from the input terminal of the first stage of inverter circuit 18 and sends the control signal CLKa to the latch circuit 17 from the output terminal of the last stage of inverter circuit 18. The generator 16 outputs the clock signal CLKa, which is delayed from the input clock signal CLK by a delay time determined by the resistors R and the capacitors C. The generator 16 is designed in such a way that the sum of the delay time and the time for one period of the clock signal CLK is longer than the time period t3. As shown in FIG. 8, the period t3 is a transfer time from when the column address latch circuit 4 latches the column address signal to when the amplified data signal provided by the sense buffer 12a arrives at the latch circuit 17. Column decoder 11 and sense buffer and I/O gate 12, as shown in FIG. 8 is essentially the same circuit as the signal transfer circuit 24 depicted in FIG. 4.

During a reading operation from the above-described synchronous DRAM 200, the row address latch circuit 3 in response to the clock signal CLK sequentially latches the row address signals output from the address buffer 9 and outputs them to the row decoder 10.

As shown in FIG. 8, upon reception of a first clock signal $CLK_1$ which is one pulse of the clock signal $CLK_1$, the column address latch circuit 4 latches the column address signal from the address buffer 9 and outputs the signal to the column decoder 11. The column decoder 11 decodes the column address signal and sends a bit line select signal to the sense buffer and I/O gate 12. A memory cell 15 is selected in accordance with the select signals from the row decoder 10 and the column decoder 11 and a data signal is read from that cell 15. The sense buffer 12a amplifies the cell data signal and outputs it to the latch circuit 17.

In response to a second clock signal $CLK_2$, the control signal generator 16 sends a clock signal $CLKa_2$ obtained by delaying the signal CLK2 to the latch circuit 17. In synchronism with the delayed clock signal CLKa2, the latch circuit 17 latches the output data signal from the sense buffer 12a and sends it to the data selector 13. The data selector 13 outputs the cell data signal from the latch circuit 17 to the output latch circuit 6.

Next, the output latch circuit 6 latches the output data signal of the data selector 13 and outputs it to the output buffer 14 in synchronism with a third clock signal $CLK_3$. The output buffer 14 in turn outputs the output data signal Dout as a read data signal.

In the above-described synchronous DRAM 200, the control signal generator 16 sends the clock signal CLKa (clock signal $CLKa_2$), which is the clock signal CLK delayed, to the latch circuit 17. Operation of the latch circuit 17 is based on the delayed clock signal CLKa. The period of delayed clock signal CLKa is the period of clock signal CLK delayed in accordance with the period t3.

The output of the clock signal CLKa from the generator 16 after the elapsing of the time t3 eliminates the need to match the signal transfer time t3 with the period of the clock signal CLK. Adjusting the delay by which the generator 16 outputs the clock signal CLK, allows for synchronizing the operation of the column address latch circuit 4, the latch circuit 17 and the output latch circuit 6 based on the clock signal CLK. This eliminates the necessity of setting the period of the clock signal to match the larger of the two propagation delays between individual latch circuits. This allows the frequency of the clock signal CLK to be increased, thereby improving the speed of reading a cell data signal.

Unlike the prior art, this embodiment requires no latch circuit for each column (bit line pair) and needs just one latch circuit 17 at the subsequent stage of the sense buffer 12a. In the case where one sense buffer 12a is provided for eight columns, for instance, the prior art has eight latch circuits 5a–5h at the subsequent stage of the column decoder 11, whereas this embodiments needs a single latch circuit 17 at the subsequent stage of sense buffer 12a. The present invention therefore allows for a reduction in the overall size of the DRAM device.

Figure 9:
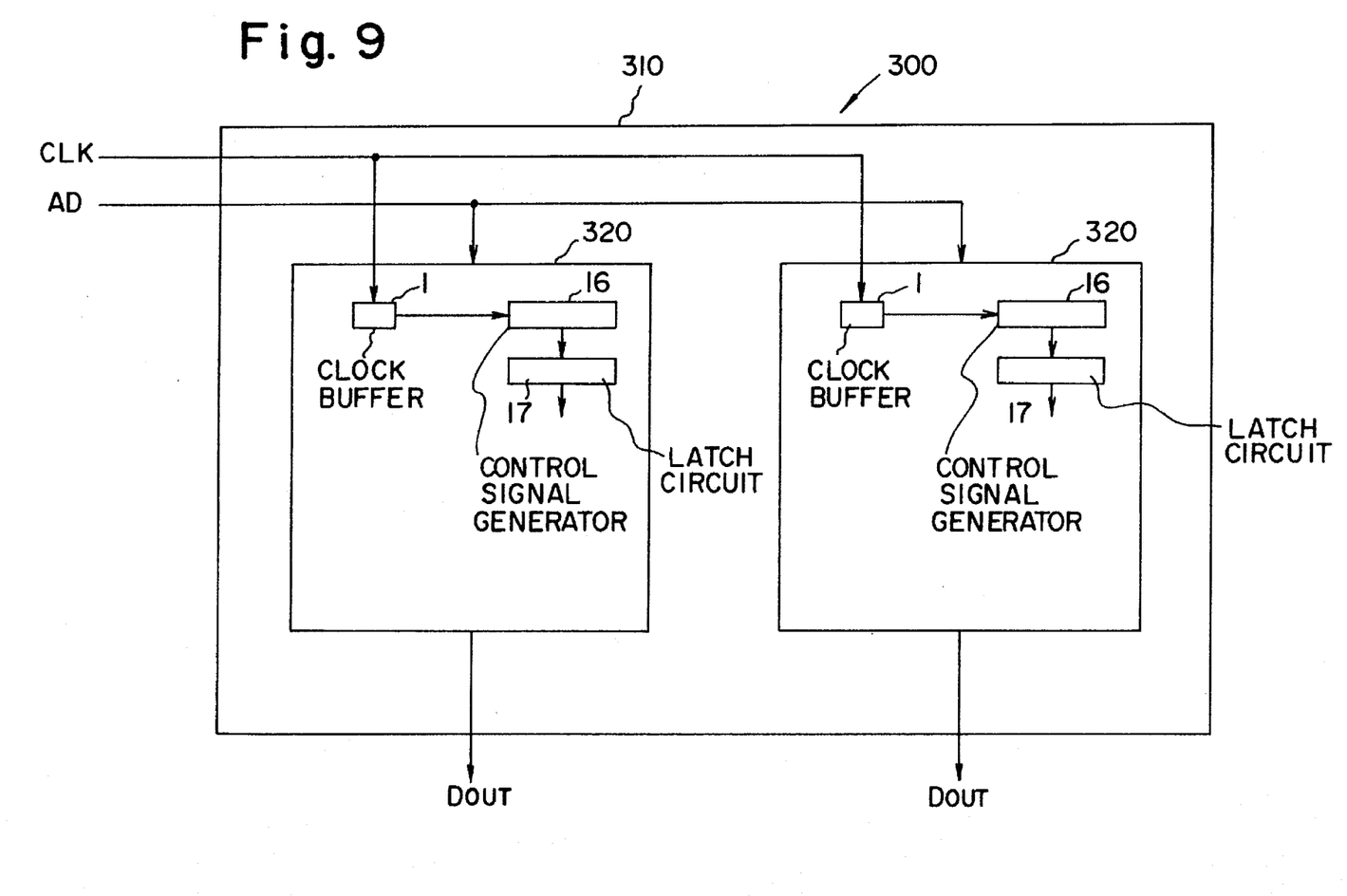
FIG. 9 is a schematic diagram showing a synchronous DRAM having two banks.

A synchronous DRAM 300 according to this invention is formed on a semiconductor chip 310, and has two banks 320 on the semiconductor chip 310 as shown in, for example, FIG. 9. The individual banks 320 have the same structure as the above-described synchronous DRAM 200, and independently perform the read or write operation in accordance with the same address signal. In this DRAM 300, the control signal generator 16 is provided in each bank 320 to set the delay time of the clock signal CLK for the associated bank 320. Both generators 16 contribute to improving the operation speed of the independently operating banks 320.

Although only one embodiment of the present invention has been described herein, it should be apparent to those skilled in the art that the present invention may be embodied in many other specific forms without departing from the spirit or scope of the invention. Particularly, it should be understood that this invention may be embodied in the following forms.

The number of the inverter circuits 18 in the control signal generator 16 or the number of the resistors and capacitors may be changed in accordance with the delay time set for the clock signal CLK.

Figure 10:
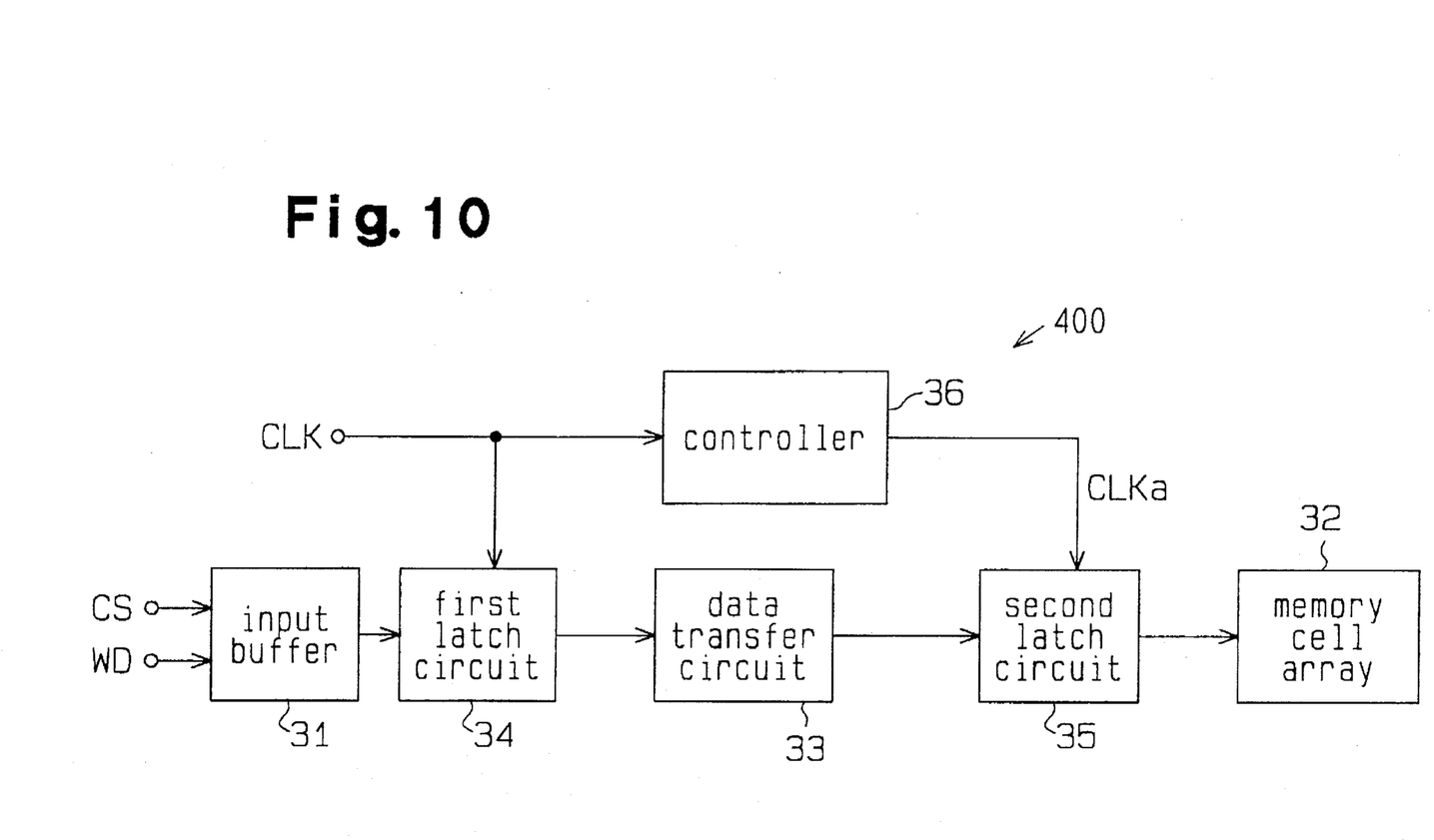
FIG. 10 is an explanatory diagram schematically showing a synchronous DRAM according to another embodiment.

Although the above-described embodiment is designed for use with data reading operations from the memory cell array 8, this invention may be adapted for the data signal writing operation. As shown in FIG. 10, for example, a synchronous DRAM 400 has an input buffer 31, a memory cell array 32, a data transfer circuit 33, first and second latch circuits 34 and 35 and a controller 36. The input buffer 31 receives an operation control signal CS and a write data signal WD, and provides the first latch circuit 34 with the control signal CS and the write data signal WD. The memory cell array 32 has a plurality of memory cells for storing data. The first latch circuit 34 latches the control signal CS and the write data signal WD in response to a clock signal CLK, and provides the data transfer circuit 33 with the control signal CS and the write data signal WD. The data transfer circuit 33 is coupled between the first and second latch circuits 34 and 35. The circuit 33 selects one of the memory cells in accordance with the control signal CS, and produces a select signal. The circuit 33 transfers the select signal and the write data signal WD to the memory cell array 32 via the second latch circuit 35. The second latch circuit 35 latches the select signal and the write data signal WD. The controller 36 is coupled to the second latch circuit 35. The controller 36 is responsive to the clock signal CLK, and controls a rate at which the second latch circuit 35 latches the select signal and the write data signal WD according to a period of time from when the first latch circuit 34 latches the control signal CS and the write data signal WD to when the select and write data signals transferred from the data transfer circuit 33 arrive at the second latch circuit 35. With this structure, even if the data transfer time between the first and second latch circuits 34 and 35 differs from the period of the clock signal CLK, the controller 36 outputs the clock signal CLKa to the second latch circuit 35 after the select and write data signals have been arrived at the second latch circuit 35. The second latch circuit 35 executes the stable signal latching in accordance with the clock signal CLKa from the controller 36.

Therefore, the present examples and embodiments are to be considered as illustrative and not restrictive and the invention is not to be limited to the details given herein, but may be modified within the scope of the appended claims.

What is claimed is:

1. A semiconductor memory device which operates in response to a control signal and a clock signal, said device comprising:

a memory cell array having a plurality of memory cells for storing data;

a first latch circuit responsive to said clock signal for receiving said control signal, and for providing a received control signal as a first received output signal;

a signal transfer circuit coupled to said memory cell array for reading a cell data signal from one of said memory cells in accordance with said first received output signal, and for transferring said read data signal therefrom;

a second latch circuit coupled to said signal transfer circuit for receiving said read data signal transferred from said signal transfer circuit, and for providing the received read data signal as a second received output signal; and a controller, coupled to said second latch circuit and responsive to said clock signal, for controlling a rate at which said clock signal arrives said second latch circuit according to a period of time from when said first latch circuit receives said control signal to when said read data signal transferred from said signal transfer circuit arrives at said second latch circuit, and for providing a rate controlled clock signal to said second latch circuit, wherein said second latch circuit receives said read signal in response to said rate controlled clock signal.

2. The semiconductor memory device according to claim 1, wherein said controller delays said clock signal according to the period of time from when said first latch circuit receives said control signal to when said read data signal transferred from said signal transfer circuit arrives at said second latch circuit and provides a delayed clock signal to said second latch circuit.

3. The semiconductor memory device according to claim 1, wherein said signal transfer circuit includes a select circuit coupled to said first latch circuit for selecting one of said memory cells in accordance with said first received output signal, and for producing a select signal; and a data signal transfer circuit coupled between said select circuit and said memory cell array for reading a cell data signal from said selected memory cell in accordance with said select signal, and for transferring said read data signal to said second latch circuit.

4. The semiconductor memory device according to claim 1 further comprising an input buffer coupled to said first latch circuit for buffering said control signal input to said memory device and for providing said first latch circuit with buffered control signal, wherein said first latch circuit receives said buffered control signal; and an output buffer coupled to said second latch circuit for buffering said second received output signal provided by said second latch circuit and for providing buffered read signal as an output signal from said memory device.

5. The semiconductor memory device according to claim 4, wherein said control signal contains a memory cell address signal, and wherein said input buffer includes an address buffer responsive to said address signal to produce a column address signal;

wherein said first latch circuit includes a column address latch circuit to receive the column address signal;

wherein said signal transfer circuit includes sense buffer for amplifying the data signal read from said memory cell array;

wherein said second latch circuit receives an amplified data signal provided by said sense buffer and provides the received amplified data signal as a second received output signal.

6. The semiconductor memory device according to claim 4 further comprising a third latch circuit, coupled between said second latch circuit and said output buffer and responsive to said clock signal for receiving said second received output signal provided by said second latch circuit.

7. The semiconductor memory device according to claim 1, wherein said controller includes a plurality of connected inverter circuits.

8. The semiconductor memory device according to claim 1, wherein said controller includes a delay circuit to control the rate at which said clock signal arrives said second latch circuit.

9. The semiconductor memory device according to claim 8, wherein said delay circuit includes a series connected inverter circuits.

10. The semiconductor memory device according to claim 9, wherein said delay circuit includes a resistor coupled between two inverter circuits, and a capacitor coupled between said resistor and ground.

11. The semiconductor memory device according to claim 1, wherein said device is formed on each of a plurality of banks in a semiconductor chip, and wherein said controller is formed in each bank.

* * * * *